US010148260B2

(12) United States Patent
Tomasovics et al.

(10) Patent No.: US 10,148,260 B2
(45) Date of Patent: Dec. 4, 2018

(54) PULSE-DENSITY MODULATED FAST CURRENT CONTROLLER

(71) Applicant: Infineon Technologies AG, Neubiberg (DE)

(72) Inventors: Attila Tomasovics, Singapore (SG); Arno Rabenstein, Munich (DE)

(73) Assignee: Infineon Technologies AG, Neubiberg (DE)

( * ) Notice: Subject to any disclaimer, the term of this patent is extended or adjusted under 35 U.S.C. 154(b) by 211 days.

(21) Appl. No.: 14/738,488

(22) Filed: Jun. 12, 2015

(65) Prior Publication Data
US 2016/0365847 A1 Dec. 15, 2016

(51) Int. Cl.
*H03K 7/08* (2006.01)
*H05B 33/08* (2006.01)
(Continued)

(52) U.S. Cl.
CPC ........... *H03K 7/08* (2013.01); *H05B 33/0815* (2013.01); *H05B 33/0857* (2013.01);
(Continued)

(58) Field of Classification Search
CPC ............ H05B 33/0824; H05B 33/0857; H05B 33/086; H05B 33/0863; H05B 33/0866; H05B 33/0869; H05B 33/0872; H02M 2001/0003; H02M 2001/0006; H02M 2001/0009; H02M 2001/0012; H02M 2001/0016; H02M 2001/0019; H02M 2001/0022; H02M 2001/0025; H02M 2001/0029; H02M 2001/0032;
(Continued)

(56) References Cited

U.S. PATENT DOCUMENTS

| 7,102,340 B1* | 9/2006 | Ferguson | ............... | H02M 3/157 |
| | | | | 323/282 |
| 8,427,123 B2* | 4/2013 | Dearborn | ............... | H02M 3/156 |
| | | | | 323/273 |

(Continued)

FOREIGN PATENT DOCUMENTS

| CN | 102105005 A | 6/2011 |
| CN | 102449894 A | 5/2012 |
| CN | 102460962 A | 5/2012 |

OTHER PUBLICATIONS

Karaarslan et al., "The Analysis of AC-DC Boost PFC Converter Based on Peak and Hysteresis Current Control Techniques," International Journal on Technical and Physical Problems of Engineering, IJTPE, vol. 3, No. 2, Jun. 2011, 6 pp.

(Continued)

*Primary Examiner* — Patrick Chen
(74) *Attorney, Agent, or Firm* — Shumaker & Sieffert, P.A.

(57) ABSTRACT

Methods, devices, techniques, and circuits are disclosed for fast current control of a buck converter. In one example, a device includes a pulse density modulator, an analog comparator, and an interconnect circuit. The analog comparator has a first input connected to a peak current reference. The interconnect circuit has a first input connected to an output of the pulse density modulator and a second input connected to an output of the analog comparator. The device has an output terminal of the interconnect circuit.

14 Claims, 7 Drawing Sheets

(51) Int. Cl.
   *H02M 3/156* (2006.01)
   *H02M 1/00* (2006.01)
(52) U.S. Cl.
   CPC .... *H02M 3/156* (2013.01); *H02M 2001/0003* (2013.01); *Y02B 20/347* (2013.01)
(58) Field of Classification Search
   CPC . H02M 2001/0035; H02M 2001/0038; H02M 2001/0041; H02M 3/156; H02M 3/1563; H02M 3/157; H02M 3/158; H02M 3/1582; H02M 3/1584; H02M 3/1588
   USPC .......................................................... 327/175
   See application file for complete search history.

(56) References Cited

U.S. PATENT DOCUMENTS

| | | | |
|---|---|---|---|
| 2006/0221528 A1* | 10/2006 | Li ........................... | H02M 1/32 361/100 |
| 2010/0231132 A1 | 9/2010 | Logiudice et al. | |
| 2011/0140627 A1* | 6/2011 | Kong ................. | H05B 33/0818 315/250 |
| 2012/0056670 A1* | 3/2012 | Slavov ................... | H03F 3/217 330/251 |
| 2014/0043176 A1 | 2/2014 | Tomasovics et al. | |
| 2015/0116382 A1* | 4/2015 | Im ....................... | G09G 3/3406 345/691 |

OTHER PUBLICATIONS

Office Action, in Chinese language, from counterpart Chinese Patent Application No. 201610382330.0, dated Mar. 12, 2018, 7 pp.

* cited by examiner

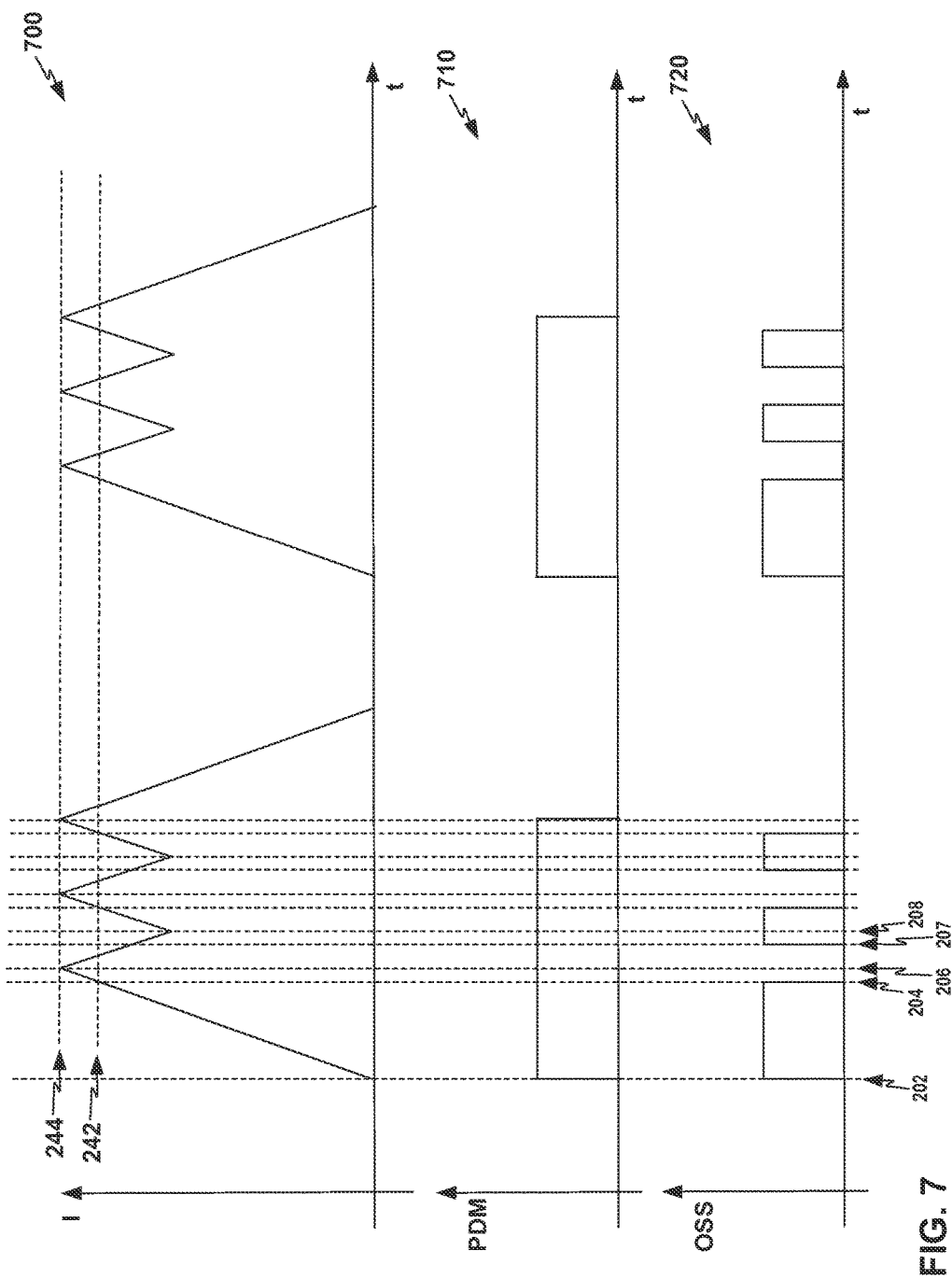

PULSE-DENSITY MODULATED FAST CURRENT CONTROLLER

TECHNICAL FIELD

This disclosure relates to electrical power converters, and in particular, to electronic controls for electrical power converters.

BACKGROUND

Electrical power converters are used to meet specialized current and voltage requirements of a load with the available source power. For example, chains of light-emitting diodes (LEDs) may require a certain DC voltage and current for proper operation. LED chains may typically be powered with two-stage control gear including an AC-DC voltage converter and a DC-DC current converter, typically a step-down or buck converter with a lower output voltage than input voltage.

An LED chain controller may be either analog or digital. An analog controller causes the illumination to be proportional to the current, which has the advantages of simplicity and fast response time. However, the response of illumination to current is non-linear, and the frequency spectrum of the illumination also varies with current, causing the color of the light to change with the brightness. Digital DC-DC current converter controllers are thus preferred for many applications. A digital controller may adjust the illumination of the LED chain by switching the current on and off at a high rate, preferably fast enough to be below the threshold of detection by human perception, such that the human brain only detects constant illumination. If the switching frequency fails to be faster than the limits of human perception, though, people become able to perceive a noticeable flickering of the light.

SUMMARY

In general, various examples of this disclosure are directed to digital DC-DC current converter controllers that combine a pulse-density modulator, one or more analog comparators, and a switch circuit, for very fast and efficient current switching. Many existing current converter controllers use pulse width modulation, struggle to maintain a high switching frequency in the DC-DC buck converter, require the bulk and expense of a large inductor to compensate for the limited switching frequency in limiting ripple current, and require the expense of either a large number of electronic components or a high-performance central processing unit (CPU). Due to the large inductor, they are unable to switch the current on and off fast enough at non-zero and non-maximum illumination levels to make flickering imperceptible. A fast, switched-mode current controller of this disclosure may be modulated by a pulse density modulator to accurately control perceived LED brightness in a way that may avoid perceptible flickering anywhere in a variable range of brightness, among other advantages. A fast, switched-mode current controller of this disclosure may use a low number of components, and no CPU involved in the switching, enable use of a converter with a small inductor, and provide very fast switching with precision brightness and color control with a small and very efficient device, resulting in no perceptible flickering, among other advantages.

One example is directed to a device configured for fast current control of a buck converter. The device includes a pulse density modulator, an analog comparator, and an interconnect circuit. The analog comparator has a first input connected to a peak current reference. The interconnect circuit has u first input connected to an output of the pulse density modulator and a second input connected to an output of the analog comparator. The device has an output terminal of the interconnect circuit.

Another example is directed to a microcontroller configured for fast current control of a buck converter. The microcontroller includes a pulse density modulator, an analog comparator, and an interconnect circuit. The analog comparator has a first input connected to a peak current reference. The interconnect circuit has a first input connected to an output of the pulse density modulator and a second input connected to an output of the analog comparator. The microcontroller has an output terminal of the interconnect circuit.

Another example is directed to a method for fast current control of a buck converter. The method includes generating a pulse density modulated output. The method further includes outputting, via an analog path, on-time signal based on the pulse density modulated output. The method further includes performing an analog comparison of a measured current with a peak current reference. The method further includes outputting, via the analog path, in response to determining that the measured current has reached the peak current reference, an off-time signal instead of the on-time signal.

The details of one or more examples of this disclosure are set forth in the accompanying drawings and the description below. Other features, objects, and advantages will be apparent from the description and drawings, and from the claims.

BRIEF DESCRIPTION OF DRAWINGS

FIG. 7 shows time-aligned graphs of a pulse density modulation (PDM) output bitstream signal, a controller output switching signal (OSS), and an output LED current, demonstrating the relationship between them, in an example implementation.

DETAILED DESCRIPTION

Figure 1:
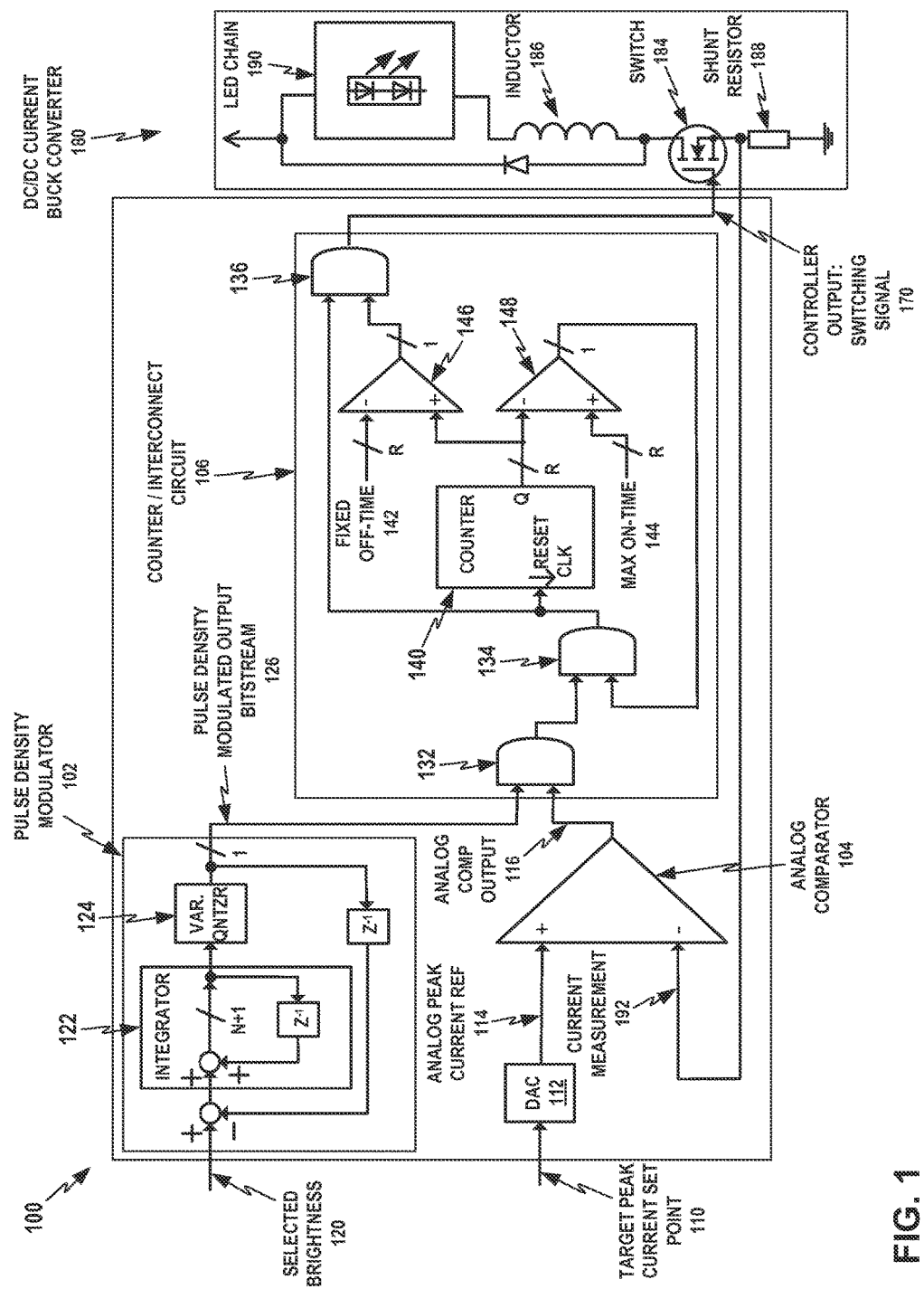
FIG. 1 depicts a block diagram illustrating a pulse-density modulated fast peak current controller with a fixed off time, in accordance with an example of this disclosure.

FIG. 1 depicts a block diagram illustrating a pulse-density modulated fast peak current controller 100 with a fixed off time, in accordance with an example of this disclosure. Fast peak current controller 100 includes pulse density modulator (PDM) 102, analog comparator 104, and counter/connection circuit 106, in this example. Fast peak current controller 100 has a target peak current reference set point line 110, a selected brightness input line 120, and a switching output line 170 (each of which may include a conductive wire, pin, or terminal, for example). Switching output 170 is connected to the switch 184 of a DC-DC current buck converter 180, which powers an LED chain 190. Fast peak current controller 100 may provide very high switching frequency, such as higher than 5 megahertz (MHz) in some examples, with very low current sensing delay, such as around or below 100 nanoseconds (ns) in some examples, as further explained below. Fast peak current controller 100 may thus enable precision brightness and color control for LED chain 190 with switching frequency far beyond the threshold of human perception, ensuring the absence of a perceptible flicker effect, and without requiring a CPU in the current control loop or a large inductor in the converter, as further explained below. Fast peak current controller 100 may be implemented as a microcontroller in some examples.

As FIG. 1 shows, target peak current reference set point 110 is connected through a digital-to-analog converter (DAC) 112 to provide an analog peak current reference line 114 to one input of analog comparator 104. Target peak current reference set point 110 may be set once in view of the buck converter 180 and LED chain 190 to be controlled by fast peak current controller 100, and may set a target peak current for DC-DC current converter 180. The other input to analog comparator 104 is connected to current measurement line 192 which is connected between switch 184 and shunt resistor 188 of buck converter 180.

Selected brightness input line 120 is connected to a user input interface enabling user to select a brightness of the light of LED chain 190. Pulse density modulator 102 includes an integrator 122 and a quantizer 124 as shown in FIG. 1, and may output current pulses of constant width and of density over time in a pulse density modulated output bitstream 126 that varies in response to selected brightness input 120. Pulse density modulated output bitstream 126 as outputted by PDM 102 and analog comparator output 116 outputted by analog comparator 104 are both connected as inputs to counter/interconnection circuit 106.

Counter/interconnect circuit 106 includes AND gates 132, 134, and 136; counter 140; fixed off-time input line 142; maximum on-time input line 144; and comparators 146 and 148. Pulse density modulated output bitstream 126 and analog comparator output 116 are both connected as inputs to AND gate 132. The outputs of AND gate 132 and comparator 148 are connected as inputs to AND gate 134. The output of AND gate 134 is connected to one input of AND gate 136 and to the reset input of counter 140, while the output of comparator 146 is connected to the other input of AND gate 136. The output of counter 140 is connected to one input of each of comparators 146 and 148; the other input to comparator 146 is connected to fixed off-time input line 142, and the other input to comparator 148 is connected to a maximum on-time signal 144. The output of AND gate 136 functions as the switching output 170 of fast peak current controller 100 and as the on/off signal for switch 184 of buck converter 180. Switch 184 may be implemented as a metal-oxide semiconductor field effect transistor (MOSFET). Switch 184 controls turning current on and off to LED chain 190. With switch 184 on, the current through LED chain 190 and inductor 186 rises, at a rate of increase limited by inductor 186.

When a selected brightness signal 120 is inputted, pulse density modulator 102 converts it to a bit stream with a high rate of change. This bit stream is an on-off signal that contains ON and OFF pulses. ON pulses may be considered equivalent to a 1 or a high bit in the bitstream 126, and OFF pulses may be considered equivalent to a 0 or a low bit in the bitstream 126. When this pulse density modulated output bit stream 126 changes from 0 to 1 (ON pulse starting), fast peak current controller 100 initially turns switch 184 on, and current rises through LED chain 190 and inductor 186 linearly and proportionately to input voltage. The voltage also rises between switch 184 and shunt resistor 188, which feeds as current measurement signal 192 to analog comparator 104. Analog comparator 104 thus responds to current measurement signal 192 exceeding analog peak current reference line 114 by generating an output that switches switching output 170 off and turns switch 184 off. With switch 184 off, the current through LED chain 190 and inductor 186 declines, at a rate of decrease limited by inductor 186. The decrease in current is linear and proportional to the forward voltage of LED chain 190. Switching output 170 may remain off for a fixed off time governed by a fixed off-time signal provided via fixed off-time input line 142, after which fast peak current controller 100 turns switching output 170 back on again. Counter/interconnect circuit 106 thus comprises a fixed off-time control circuit that is configured to provide an output to turn switch 184 off for fixed off times.

Fast peak current controller 100 may thus alternate switching output 170 on and off at a high rate, keeping the current through LED chain 190 and inductor 186 oscillating at a high rate within a tightly constrained range with small ripple current, as described further below with reference to FIG. 2. Detecting of the current measurement 192 through switch 184 hitting the analog peak current reference 114 is thus performed by an analog comparator 104 which may have very fast detection time, and the off signal triggered by this detection may only need to propagate through a series of three AND gates 132, 134, 136 to switch 184, which may provide very fast propagation time. Fast peak current controller 100 may thus provide both very low detection delay and very low propagation delay in controlling switch 184 to turn on and off with reference to a selected target peak current set point 110, and thus provide LED chain 190 current switching that is both very fast and precisely referenced.

Figure 2:
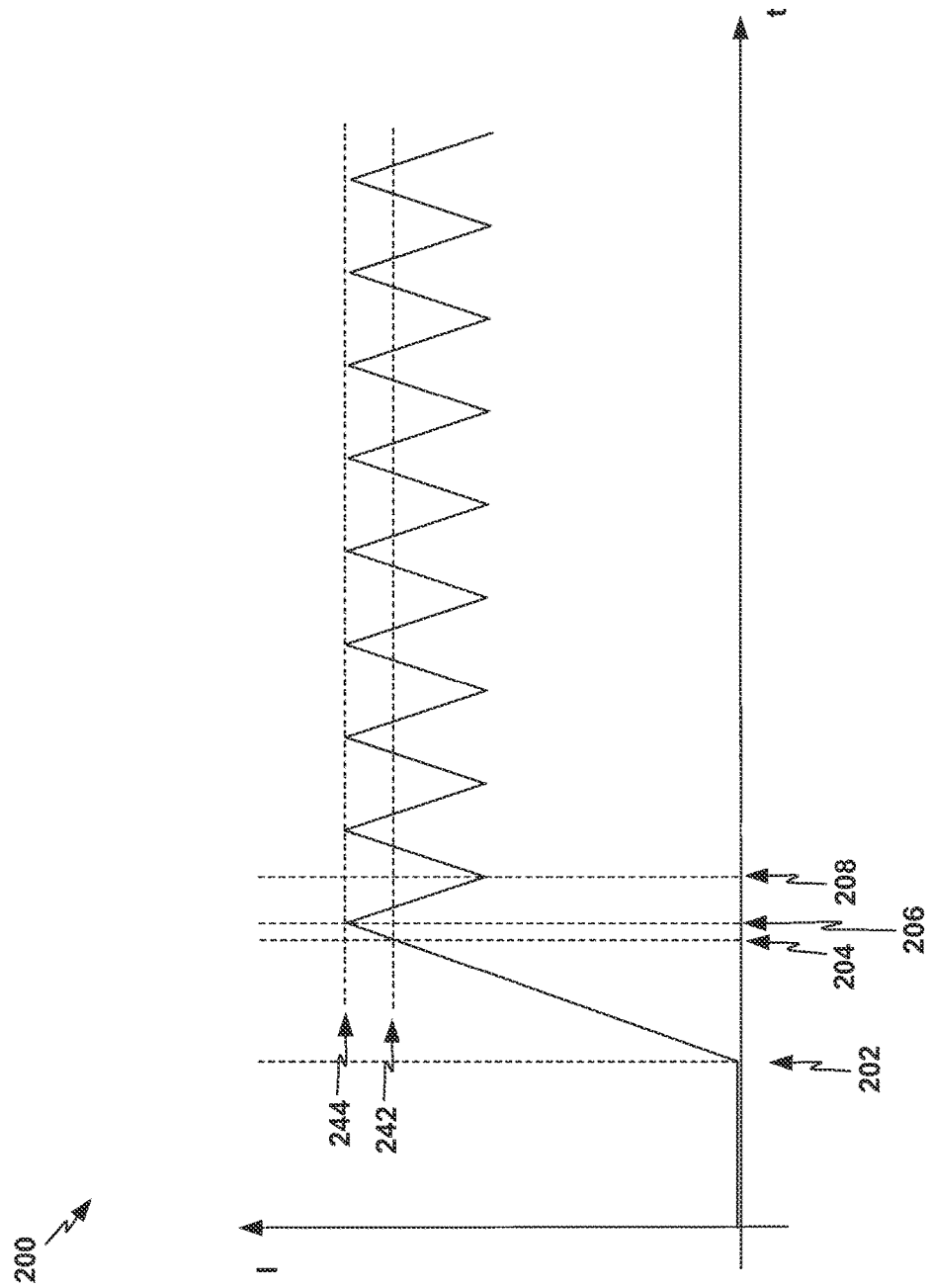
FIG. 2 depicts a graph of current output over time by the DC-DC current buck converter of FIG. 1 under control of the fast peak current controller of FIG. 1, in accordance with an example of this disclosure.

FIG. 2 depicts a graph 200 of current output (y-axis) over time (x-axis) by DC-DC current buck converter 180 of FIG. 1 under control of fast peak current controller 100 of FIG. 1, in accordance with an example of this disclosure. Current initially begins rising at time 202 in response to a user input to switch on LED chain 190, which is entered via selected brightness input line 120 to activate fast peak current controller 100 to turn on switch 184 and control current to flow through buck converter 180 to LED chain 190. At time 204, the rising current through buck converter 180 passes the peak reference current 242, as provided via analog peak current reference 114 shown in FIG. 1, to trigger an output in analog comparator 104. Current continues to rise for a finite time interval 204-206 due to non-zero detection and propagation delay to hit actual peak current 244 until time 206 when the off signal output via output 170 from fast peak current controller 100 propagates to switch 184 to turn switch 184 off.

Current continues to decrease for a time interval 206-208 based on the fixed off-time signal provided via fixed off-time input line 142, where the actual off time also includes propagation delay in initially triggering the output of comparator 146 to convey the signal from fixed off-time input line 142 and propagation delay for the end of the off-time signal to cycle through counter/interconnect circuit 106. Fast peak current controller 100 thereafter generates a new on signal via output 170 to switch 184 at time 208. The cycle of on and off signals from fast peak current controller 100 to switch 184 thus repeats, providing fast current control to buck converter 180 and LED chain 190. The output of analog comparator 104 to turn switch 184 off is directly fed along an entirely analog path through counter/interconnect circuit 106, and may thereby have very low delay, such as around or below 100 nanoseconds (ns), in turning off switch 184. This low delay may enable switching frequencies in excess of 5 megahertz (MHz), in some examples. This very high switching frequency may enable use of a buck converter having a small inductor, resulting in significant overall size reduction and high quality brightness control. Also, this very high switching frequency may enable pulse density modulator 126 to be fast, e.g., to have a high clock frequency in excess of 1 MHz, or, equivalently, bit times of less than 1 microsecond, resulting in frequency components beyond human perception. In contrast to some existing devices which include a CPU or other complex, high-load components in a converter switching control loop, fast peak current controller 100 may thus control current to LED chain 190 with precision control of brightness and color, no perceptible flicker, with low ripple current and high efficiency, and with a small and low-cost device.

As shown in FIG. 1, maximum on-time signal input 144 may act as a backup safeguard against the possibility of allowing switch 184 to remain on for too long at one time. Maximum on-time signal input 144 may typically not come into effect in normal operation, and in some examples may not be needed, such that some implementations of this disclosure may be analogous to the example of FIG. 1 but without maximum on-time signal input 144, comparator 148, or AND gate 134, and with the output of AND gate 132 feeding straight to the inputs of AND gate 136 and counter 140.

Figure 3:
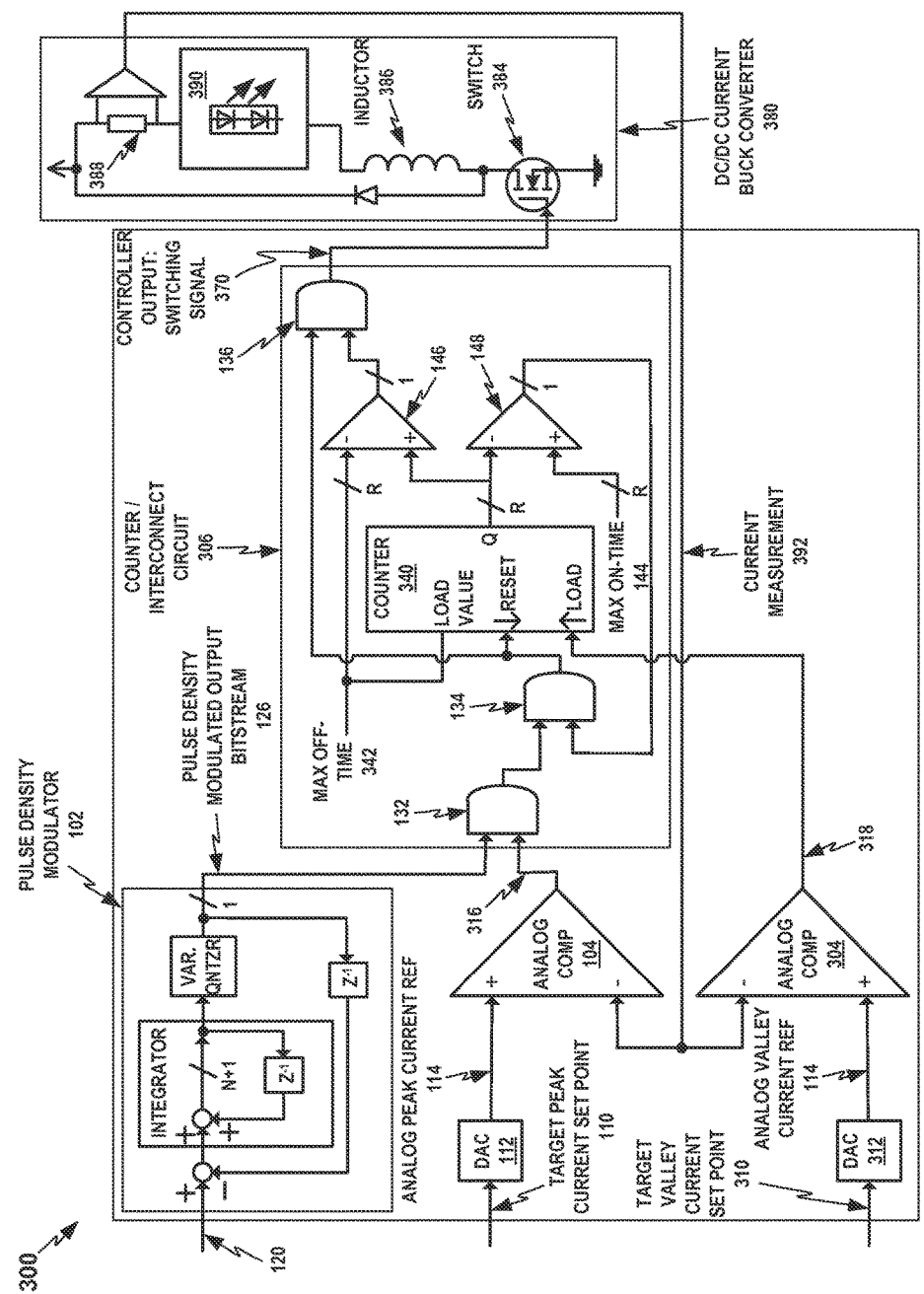
FIG. 3 depicts a block diagram illustrating a pulse-density modulated fast peak/valley current controller, in accordance with another example of this disclosure.

FIG. 3 depicts a block diagram illustrating a pulse-density modulated fast peak/valley current controller 300, in accordance with another example of this disclosure. Fast peak/valley current controller 300 has some components and structure analogous to fast peak current controller 100 of FIG. 1, including pulse density modulator 102, and analog comparator 104 with one input connected to target peak current set point 110, DAC 112, and analog peak current reference 114. Fast peak/valley current controller 300 also has a second analog comparator 304 with one input connected to a target valley current set point 310, fed through a DAC 312 to provide an analog valley current reference. Analog comparators 104 and 304 may thus also be referenced as peak reference analog comparator 104 and valley reference analog comparator 304, respectively. Fast peak/valley current controller 300 may also be implemented as a microcontroller in some examples.

Fast peak/valley current controller 300 thus enables set points to be selected for both a target peak current reference and a target valley current reference. The valley current reference functions in place of the fixed off time of fast peak current controller 100 described above with reference to FIG. 1. Fast peak/valley current controller 300 thus enables the further degree of precision control of selectably controlling the valley current, in contrast to fast peak current controller 100 of FIG. 1, with the trade-off of having an additional analog comparator.

Fast peak/valley current controller 300 is connected to DC/DC current buck converter 380 which powers LED chain 390. Buck converter 380 is analogous to buck converter 180 of FIG. 1 except for the arrangement of shunt resistor 388. A current measurement signal line 392 connected to either side of shunt resistor 388 feeds into the inverting inputs of both peak reference analog comparator 104 and valley reference analog comparator 304, enabling analog comparators 104 and 304 to compare the current through buck converter 380 to the analog peak and valley reference currents, respectively. The peak reference analog comparator output. 316 from peak reference analog comparator 104 is connected to one input of AND gate 132, the other input of which is connected to the output of PDM 102, as in the example of FIG. 1.

Counter/interconnect circuit 306 differs from the example of FIG. 1 in that counter 340 uses load value and load inputs in addition to the reset input connected to the output of AND gate 134, and the use of a maximum off-time signal line 342 that provides a maximum off-time rather than a fixed off time. Maximum off-time signal line 342 is connected to both the load value input of counter 340 and to the inverting input of comparator 146. As with maximum on-time signal line 144 described above, which also occurs in counter/interconnect circuit 306 of peak/valley fast current controller 300, maximum off-time signal line 342 may not play an active role in normal operation, but instead may function as a backup safeguard secondary to valley reference current control by peak/valley fast current controller 300.

The valley reference analog comparator output 318 from valley reference analog comparator 304 is connected to the load input of counter 340, thus replacing the off-time signal and controlling when fast peak/valley current controller 300 turns the controller output switching signal 370 back on. Fast peak/valley current controller 300 thus controls switch 384 to turn off and the current through buck converter 380 to decrease when fast peak/valley current controller 300 detects that the current through buck converter 380 has hit the selected peak, and controls switch 384 to turn on and the current through buck converter 380 to increase when fast peak/valley current controller 300 detects that the current through buck converter 380 has hit the selected valley. This is further illustrated in FIG. 4.

Figure 4:
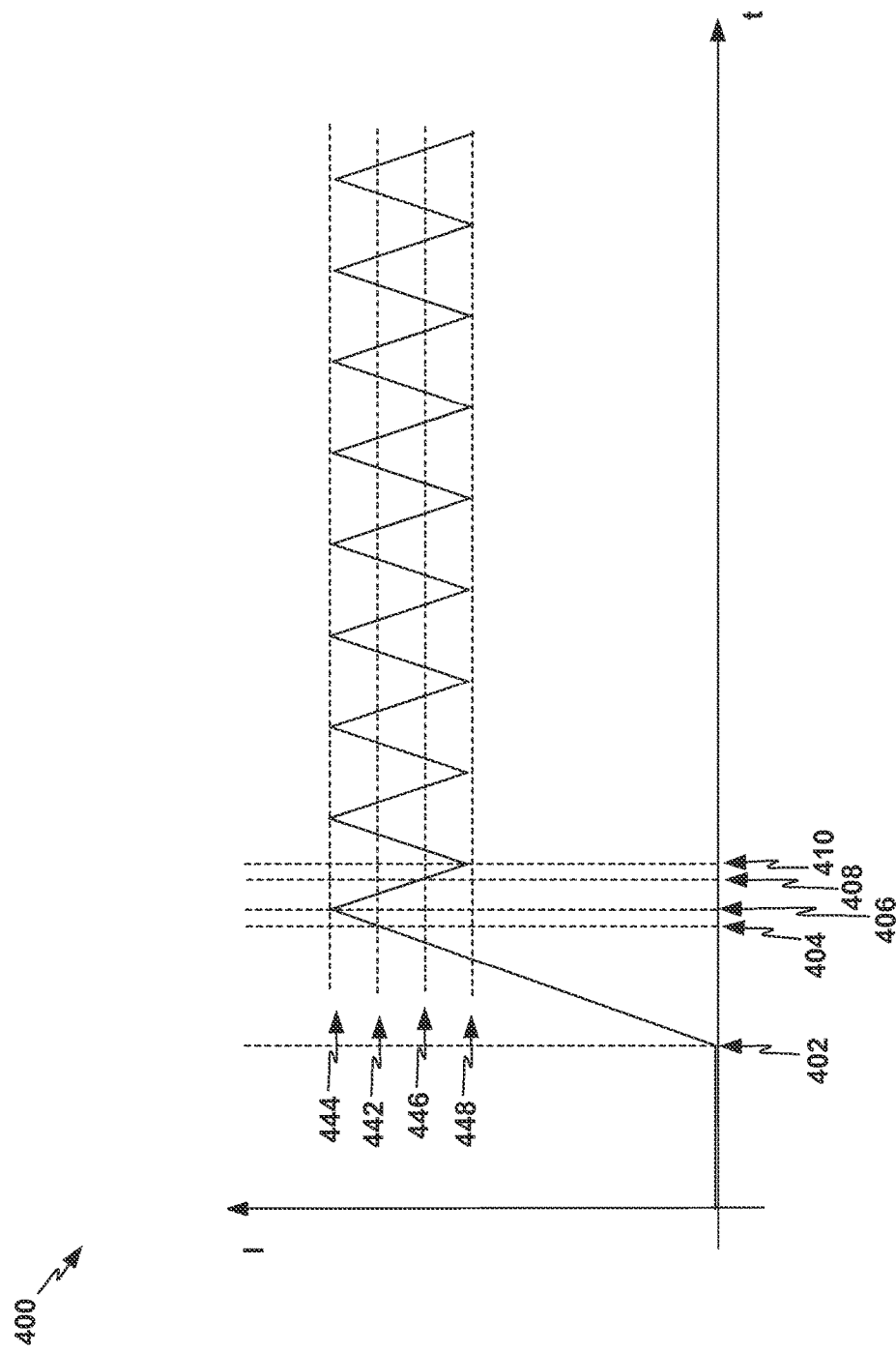
FIG. 4 depicts a graph of current output over time by the DC-DC current buck converter of FIG. 3 under control of the fast peak/valley current controller of FIG. 3, in accordance with an example of this disclosure.

FIG. 4 depicts a graph 400 of current output over time by DC-DC current buck converter 380 of FIG. 3 under control of the fast peak/valley current controller 300 of FIG. 3, in accordance with an example of this disclosure. The current described by graph 400 is initially analogous to that of FIG. 2 as described above. Current initially begins rising at time 402 in response to PDM output bitstream 126 turning ON, or changing from 0 to 1, to activate fast peak current controller 300 to turn on switch 384 and control current to flow through buck converter 380 to LED chain 390. At time 404, the rising current through buck converter 380 passes the peak reference current 442, as provided via analog peak current reference 114 shown in FIG. 3. Peak reference analog comparator 104 responds to detecting the current hitting peak reference current 442 by generating an output to counter/interconnect circuit 306. Current continues to rise for a finite time interval 404-406 due to non-zero detection and propagation delay to hit actual peak current 444 until time 406 when the off signal output via output 370 from fast peak current controller 300 propagates to switch 384 to turn switch 384 off.

Current then decreases for a time interval 406-408 until the falling current hits the valley current reference value 446, triggering a detection by valley reference analog comparator 304. As with the peak current reference value 442, the current also slightly overshoots the valley current reference value 446 as propagation of the function and effects of valley reference analog comparator 304 take a finite interval of time 408-410 before the controller output 370 controls switch 384 to turn back on. Current through buck converter 380 decreases to actual current valley 448 before beginning to rise again in response to the effect of switch 384 turning back on, and the cycle repeats. The total interval of time may be less than 10 ns and the switching frequency higher than 5 MHz, in various examples. Fast peak/valley current controller 300 of FIG. 3 may thus provide fast current control with a selectably controlled valley current reference as well as a selectably controlled peak current reference. Fast peak/valley current controller 300 of FIG. 3 may thus provide fast valley current detection which may further contribute to overall fast current control.

Figure 5:
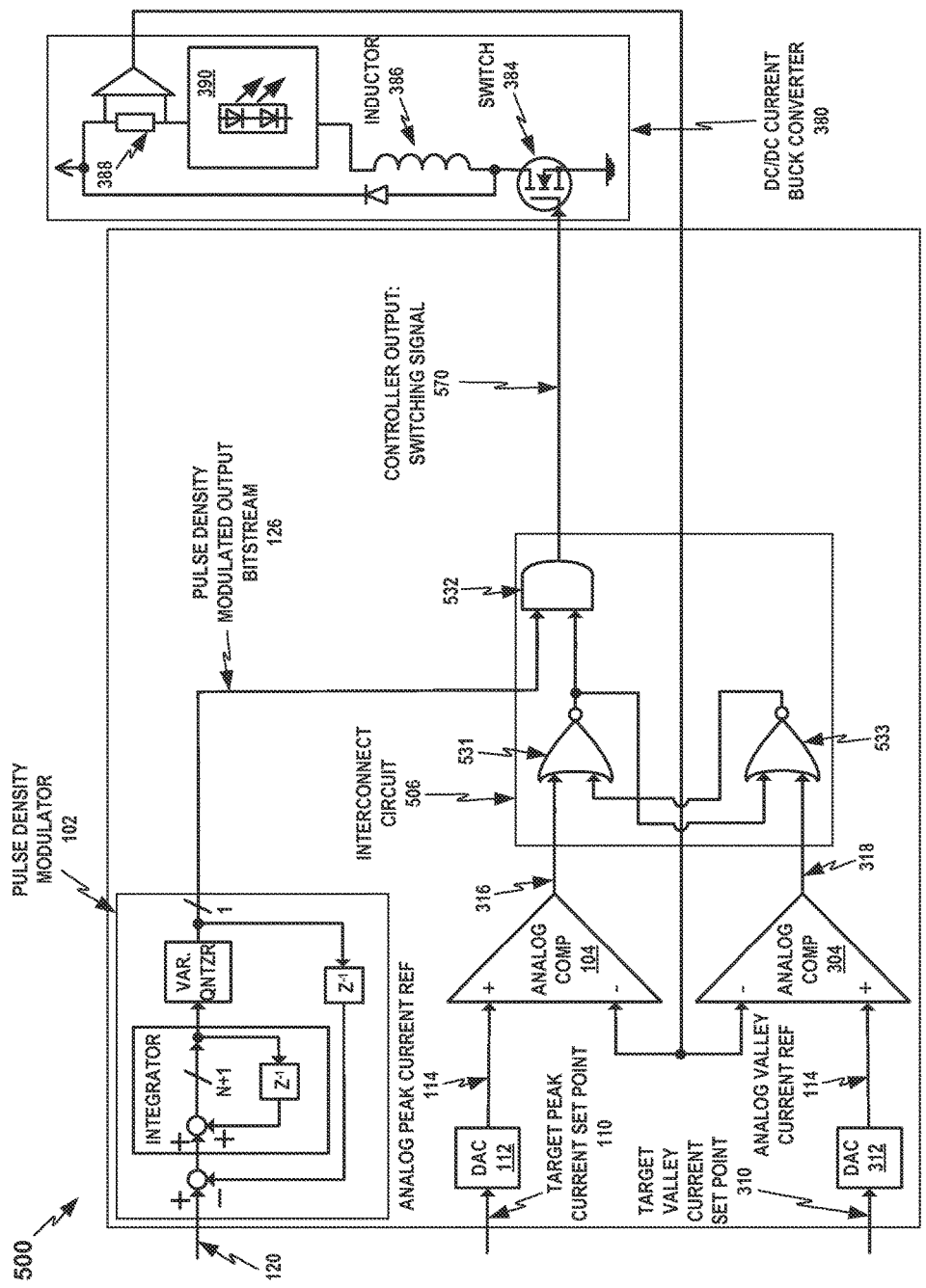
FIG. 5 depicts a block diagram illustrating a pulse-density modulated fast hysteretic current controller, in accordance with an example of this disclosure.

FIG. 5 depicts a block diagram illustrating a pulse-density modulated fast hysteretic current controller 500, in accordance with another example of this disclosure. Fast hysteretic current controller 500 is analogous in some respects to the examples of FIGS. 1 and 3, such as pulse density modulator 102, and more in common with the example of FIG. 3 in particular, having both peak reference analog comparator 104 and valley reference analog comparator 304 and their associated components and signal lines. Fast hysteretic current controller 500 differs substantially from the earlier examples in interconnect circuit 506, Which includes two NOR gates 531, 533, and only one AND gate 532, and which does not include a counter. Fast hysteretic current controller 500 may also be implemented as a microcontroller in some examples.

The analog peak and valley current reference outputs 516, 518 from peak reference analog comparator 104 and valley reference analog comparator 304 are each connected to one input of NOR gales 531, 533, respectively, while the other inputs of NOR gates 531, 533 are connected to each other's outputs. The outputs of NOR gates 531, 533 are also both connected to one input of AND gate 532, the other input of which is connected to PDM 102. The output of AND gate 532 functions as controller output switching signal 570, which feeds to switch 384 of DC-DC current buck converter 380 which powers LED chain 390, and is identical to buck converter 380 of FIG. 3.

Fast hysteretic current controller 500 thus functions with only a small set of analog components and no counter in interconnect circuit 506, and may thus control switch 384 based on peak and valley current references with very fast control, such as with switching times below 20 ns and at frequencies above 5 MHz in some examples. Fast hysteretic current controller 500 also results in current over time through buck converter 380 and LED chain 390 as shown in graph 400 of FIG. 4, and as described above with reference to FIGS. 3 and 4, with peak and valley references applied, though the propagation delays may differ between the various examples. Fast hysteretic current controller 500 is thus hysteretic because interconnect circuit 506 is configured to preserve and alternate the on-time and off-time state information without use of a counter.

Figure 6:
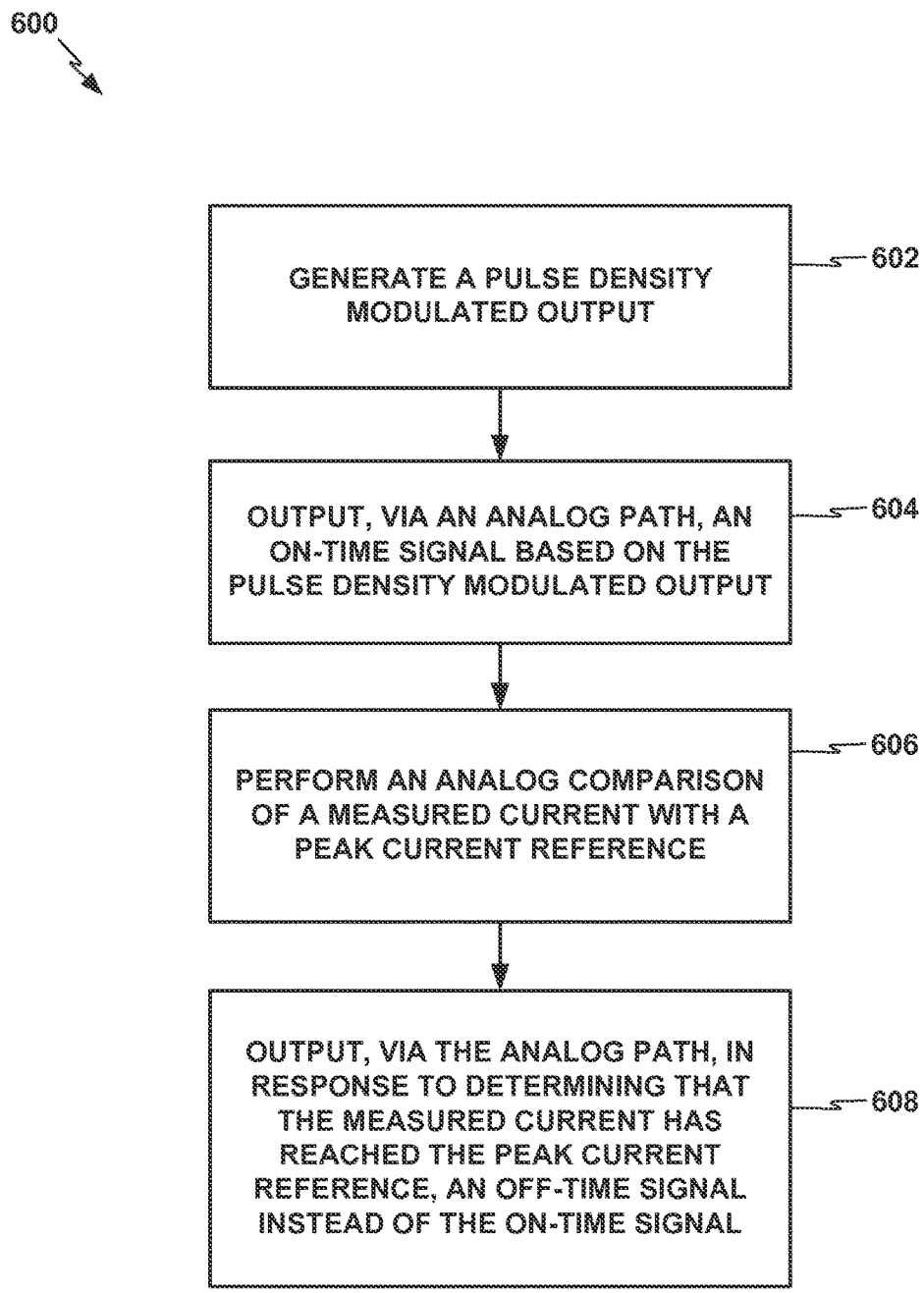
FIG. 6 depicts a flowchart illustrating a method of fast control of the switching of a DC-DC buck converter implemented by a fast current controller, in accordance with an example of this disclosure.

FIG. 6 depicts a flowchart illustrating a method 600 of fast control of the switching of a DC-DC converter implemented by a fast current controller (e.g., fast peak current controller 100 of FIG. 1, fast peak/valley current controller 300 of FIG. 3, or fast hysteretic current controller 500 of FIG. 5 as described above), in accordance with an example of this disclosure. Method 600 includes generating a pulse density modulated output (e.g., a PDM output signal generated by pulse density modulator 102 of fast peak current controller 100 of FIG. 1, fast peak/valley current controller 300 of FIG. 3, or fast hysteretic current controller 500 of FIG. 5) (602). Method 600 further includes outputting, via an analog path (e.g., via counter/interconnect circuit 100 of FIG. 1, counter/interconnect circuit 300 of FIG. 3, or interconnect circuit 500 of FIG. 5), an on-time signal based on the pulse density modulated output (e.g., an on-time output signal via controller output 170, 370, 570 to switch 184, 384 resulting in the rise in current shown in time interval 202-204 in FIG. 2 or time interval 402-404 in FIG. 4) (604).

Method 600 further includes performing an analog comparison of a measured current with a peak current reference (e.g., measuring, via an analog path, by analog comparator 104 of fast peak current controller 100 of FIG. 1, fast peak/valley current controller 300 of FIG. 3, or fast hysteretic current controller 500 of FIG. 5, whether the measured current has reached a peak current reference) (606). Method 600 further includes outputting, via the analog path, in response to determining that the measured current has reached the peak current reference, an off-time signal instead of the on-time signal (e.g., the output of analog comparator 104 via counter/interconnect circuit 100 of FIG. 1, counter/interconnect circuit 300 of FIG. 3, or interconnect circuit 500 of FIG. 5, to turn the switching output off, such as for a predetermined amount of time or until determining via measuring via an analog path that the measured current has reached a valley current reference, after which the on-time signal may again be outputted) (608).

FIG. 7 shows time-aligned graphs of the pulse density modulation (PDM) output bitstream signal 710, the controller output switching signal (OSS) 720, and the output LED current 700, demonstrating the relationship between them, in an example implementation that may be applicable to one of current controllers 100, 300, 500 as described above. The output LED current graph 700 of FIG. 7 is analogous to graph 200 of output current as shown in FIG. 2, including initial current on time 202, peak reference current intercept time 204, switch off time 206, new on signal propagation time 208, peak reference current 242, and actual peak current 244, as discussed above with reference to FIG. 2. FIG. 7 shows the propagation delay between peak reference current intercept time 204, when the output switching signal turns off, and switch off time 206, after the output switching signal propagates and the output LED current reaches its actual peak 244 before falling. FIG. 7 also analogously shows new on signal generation time 207 when the output switching signal turns back on, and the propagation delay between new on signal generation time 207 and new on signal propagation time 208. As shown comparing graphs 710 and 720, the output switching signal may initially turn on in reaction to the PDM output bitstream switching on, and the output switching signal may later switch between off and on while the PDM output bitstream remains on, to maintain the output current in the specified range.

Any of the circuits, devices, and methods described above may be embodied in or performed in whole or in part by any of various types of integrated circuits, chip sets, and/or other devices, and/or as software executed by a computing device, for example. This may include processes performed by, executed by, or embodied in one or more microcontrollers, central processing units (CPUs), processing cores, field-programmable gate arrays (FPGAs), programmable logic devices (PLDs), virtual devices executed by one or more underlying computing devices, or any other configuration of hardware and/or software.

Various illustrative aspects of the disclosure may be implemented as in the following examples, numbered A1-A20:

A1. A device comprising: a pulse density modulator; an analog comparator having a first input connected to a peak current reference; an interconnect circuit having a first input connected to an output of the pulse density modulator and a second input connected to an output of the analog comparator; and an output terminal of the interconnect circuit.

A2. A device of example A1, wherein the analog comparator has a second input connected to a current measurement line configured to measure a current in a converter that is connected to the output terminal of the interconnect circuit.

A3. A device of any combination of examples A1 or A2, wherein the interconnect circuit is configured to output an on-time signal based on the peak current reference.

A4. A device of any combination of examples A1-A3, wherein the interconnect circuit comprises a fixed off-time control circuit.

A5. A device of any combination of examples A1-A4, wherein the interconnect circuit comprises a counter having an input connected to the output of the analog comparator.

A6. A device of any combination of examples A1-A5, wherein the analog comparator is a first analog comparator, the device further comprising a second analog comparator with a first input connected to a valley current reference, wherein the interconnect circuit is configured to output an on-time signal based on the peak current reference, and to output an off-time signal based on the valley current reference.

A7. A device of any combination of examples A1-A6, wherein the interconnect circuit comprises a timer having a first input connected to the output of the first analog comparator, and a second input connected to the output of the second analog comparator.

A8. A device of any combination of examples A1-A7, wherein the counter circuit comprises a first nor gate, a second nor gate, and an and gate.

A9. A device of any combination of examples A1-A8, wherein the first nor gate has a first input connected to the output of the first analog comparator, wherein the first nor gate has a second input connected to an output of the second nor gate, wherein the second nor gate has a first input connected to the output of the second analog comparator, wherein the second nor gate has a second input connected to an output of the first nor gate, and wherein the and gate has a first input connected to the output of the pulse density modulator, and a second input connected to the output of the first nor gate.

A10. A device of any combination of examples A1-A9, wherein the peak current reference comprises a selected target peak current set point, and an analog peak current reference based on the selected target peak current set point.

A11. A microcontroller comprising: a pulse density modulator; an analog comparator having a first input connected to a peak current reference; an interconnect circuit having a first input connected to an output of the pulse density modulator and a second input connected to an output of the analog comparator; and an output terminal of the interconnect circuit.

A12. A microcontroller of example A11, wherein the analog comparator has a second input connected to a current measurement line configured to measure a current in a converter that is connected to the output terminal of the interconnect circuit.

A13. A microcontroller of any combination of examples A11-A12, wherein the interconnect circuit is configured to output an on-time signal based on the peak current reference.

A14. A microcontroller of any combination of examples A11-A13, wherein the interconnect circuit comprises a fixed off-time control circuit.

A15. A microcontroller of any combination of examples A11-A14, wherein the interconnect circuit comprises a counter having an input connected to the output of the analog comparator.

A16. A microcontroller of any combination of examples A11-A15, wherein the analog comparator is a first analog comparator, the device further comprising a second analog comparator with a first input connected to a valley current reference, wherein the interconnect circuit is configured to output an on-time signal based on the peak current reference, and to output an off-time signal based on the valley current reference, wherein the interconnect circuit comprises a timer having a first input connected to the output of the first analog comparator, and a second input connected to the output of the second analog comparator.

A17. A microcontroller of any combination of examples A11-A16, wherein the analog comparator is a first analog comparator, the device further comprising a second analog comparator with a first input connected to a valley current reference, wherein the interconnect circuit is configured to output an on-time signal based on the peak current reference, and to output an off-time signal based on the valley current reference, wherein the counter circuit comprises a first nor gate, a second nor gate, and an and gate, wherein the first nor gate has a first input connected to the output of the first analog comparator, wherein the first nor gate has a second input connected to an output of the second nor gate, wherein the second nor gate has a first input connected to the output of the second analog comparator, wherein the second nor gate has a second input connected to an output of the first nor gate, and wherein the and gate has a first input connected to the output of the pulse density modulator, and a second input connected to the output of the first nor gate.

A18. A method for controlling a converter, the method comprising: generating a pulse density modulated output; outputting, via an analog path, an on-time signal based on the pulse density modulated output; performing an analog comparison of a measured current with a peak current reference; outputting, via the analog path, in response to determining that the measured current has reached the peak current reference, an off-time signal instead of the on-time signal.

A19. A method of example A18, further comprising: outputting the off-time signal instead of the on-time signal for a fixed period of time; and outputting the on-time signal again in response to the fixed period of time ending.

A20. A method of any combination of examples A18-A19, further comprising: performing an analog comparison of the measured current with a valley current reference; and outputting, via the analog path, in response to determining that the measured current has reached the valley current reference, an on-time signal again.

Various examples have been described. These and other examples are within the scope of the following claims.

What is claimed is:
1. A device comprising:
a pulse density modulator configured to generate a first signal to activate a switch, during a pulse of the first signal, for a current to flow through a Light Emitting Diode (LED) chain;

an analog comparator configured to generate a second signal based on a peak current reference signal at a first input of the analog comparator and a current feedback signal at a second input of the analog comparator, wherein the current feedback signal represents a magnitude of the current flow through the LED chain during the pulse of the first signal; and an interconnect circuit that comprises an output terminal configured to be connected to the switch and that is configured to:

generate, using a first comparator, an on-time signal and generate, using a second comparator, an off-time signal to control a timing of a control signal; and output the control signal based on the on-time signal and the off-time signal and based on the first signal at a first input of the interconnect circuit and the second signal at a second input of the interconnect circuit to control a conductivity of the switch and cycle the current flow through the LED chain during the pulse of the first signal such that the control signal switches between the off-time signal and the on-time signal while the first signal remains at a logical high state.

2. The device of claim 1, wherein the interconnect circuit is configured to generate the on-time signal based on the peak current reference signal.

3. The device of claim 1, wherein the interconnect circuit is configured to generate the off-time signal based on a fixed off-time signal.

4. The device of claim 1, wherein the interconnect circuit comprises a counter having an input connected to an output of the analog comparator.

5. A microcontroller comprising:

a pulse density modulator configured to generate a first signal to activate a switch, during a pulse of the first signal, for a current to flow through a Light Emitting Diode (LED) chain;

an analog comparator configured to generate a second signal based on a peak current reference signal at a first input of the analog comparator and a current feedback signal at a second input of the analog comparator, wherein the current feedback signal represents a magnitude of the current flow through the LED chain during the pulse of the first signal; and an interconnect circuit that comprises an output terminal configured to be connected to the switch and that is configured to:

generate, using a first comparator, an on-time signal and generate, using a second comparator, an off-time signal to control a timing of a control signal; and output the control signal based on the on-time signal and the off-time signal and based on the first signal at a first input of the interconnect circuit and the second signal at a second input of the interconnect circuit to control a conductivity of the switch and cycle the current flow through the LED chain during the pulse of the first signal such that the control signal switches between the off-time signal and the on-time signal while the first signal remains at a logical high state.

6. The microcontroller of claim 5, wherein the interconnect circuit is configured to generate the on-time signal based on the peak current reference signal.

7. The microcontroller of claim 5, wherein the interconnect circuit is configured to generate the off-time signal based on a fixed off-time signal.

8. The microcontroller of claim 5, wherein the interconnect circuit comprises a counter having an input connected to an output of the analog comparator.

9. The microcontroller of claim 5, wherein the analog comparator is a first analog comparator, the device further comprising a second analog comparator with a first input connected to a valley current reference, wherein the interconnect circuit is configured to generate the on-time signal based on the peak current reference, and to generate the off-time signal based on the valley current reference, wherein the interconnect circuit comprises a counter having a first input connected to the output of the first analog comparator, and a second input connected to the output of the second analog comparator.

10. A method for controlling a converter, the method comprising:

generating, by a pulse density modulator, a first signal to activate a switch, during a pulse of the first signal, for a current to flow through a Light Emitting Diode (LED) chain;

generating, by an analog comparator, a second signal based on a peak current reference signal at a first input of the analog comparator and a current feedback signal at a second input of the analog comparator, wherein the current feedback signal represents a magnitude of the current flow through the LED chain during the pulse of the first signal;

generating, using a first comparator of an interconnect circuit, an on-time signal and generating, using a second comparator of the interconnect circuit, an off-time signal to control a timing of a control signal; and outputting generating, by the interconnect circuit, the control signal based on the on-time signal and the off-time signal and based on the first signal at a first input of the interconnect circuit and the second signal at a second input of the interconnect circuit to control a conductivity of the switch and cycle the current flow through the LED chain during the pulse of the first signal such that the control signal switches between the off-time signal and the on-time signal while the first signal remains at a logical high state.

11. The method of claim 10, further comprising:

performing a comparison of a measured current with a valley current reference, wherein generating the on-time signal is based on the comparison of the measured current with the valley current reference.

12. A device comprising:

a pulse density modulator configured to generate a first signal to activate a switch, during a pulse of the first signal, for a current to flow through a Light Emitting Diode (LED);

an analog comparator configured to generate a second signal based on a peak current reference signal at a first input of the analog comparator and a current feedback signal at a second input of the analog comparator, wherein the current feedback signal represents a magnitude of the current flow through the LED chain during the pulse of the first signal; and an interconnect circuit that comprises a counter and that comprises an output terminal configured to be connected to the switch and that is configured to:

generate, using a first comparator, an on-time signal and generate, using a second comparator, an off-time signal to control a timing of a control signal; and output the control signal based on the on-time signal and the off-time signal and based on the first signal at a first input of the interconnect circuit and the second signal at a second input of the interconnect circuit to control a conductivity of the switch and cycle the current flow through the LED chain during the pulse of the first signal such that the control signal switches between the off-time signal and the on-time signal while the first signal remains at a logical high state and as a function of an output of the counter.

13. The device of claim 1, wherein the analog comparator is a first analog comparator, the device further comprising a second analog comparator with a first input connected to a valley current reference, wherein the interconnect circuit is configured to generate the on-time signal based on the peak current reference, and to generate the off-time signal based on the valley current reference.

14. The device of claim 13, wherein the interconnect circuit comprises a counter having a first input connected to the output of the first analog comparator, and a second input connected to the output of the second analog comparator.

* * * * *

UNITED STATES PATENT AND TRADEMARK OFFICE
CERTIFICATE OF CORRECTION

PATENT NO. : 10,148,260 B2
APPLICATION NO. : 14/738488
DATED : December 4, 2018
INVENTOR(S) : Attila Tomasovics and Arno Rabenstein It is certified that error appears in the above-identified patent and that said Letters Patent is hereby corrected as shown below:

In the Claims

Column 12, Claim 10, Line 33: "…outputting generating…" should be changed to --…outputting…--

Signed and Sealed this
Tenth Day of December, 2019

Andrei Iancu
*Director of the United States Patent and Trademark Office*